United States Patent [19]

Romanelli et al.

[11] 4,296,411

[45] Oct. 20, 1981

[54] ELECTRONIC REMOTE METER READING APPARATUS

[76] Inventors: Pat Romanelli; Robert J. Romanelli, both of 224 Brook St., Harrington Park, N.J. 07640

[21] Appl. No.: 945,400

[22] Filed: Sep. 25, 1978

[51] Int. Cl.³ .................. G08C 19/00; G08C 19/16
[52] U.S. Cl. ..................... 340/870.02; 235/92 A; 235/92 EL; 324/151 R; 340/870.19
[58] Field of Search ........ 340/177 R, 188 R, 188 CH, 340/203, 190, 178, 150, 151, 347 P, 152 R, 870.02, 870.03, 870.19, 870.01, 870.27, 870.29, 870.05; 335/151, 153; 364/550, 556, 483, 511; 235/92 A, 92 MT, 92 EL; 324/151 R, 153, 146, 113; 346/14 MR

[56] References Cited

U.S. PATENT DOCUMENTS

| | | | |
|---|---|---|---|
| 3,737,858 | 6/1973 | Turner et al. | 340/203 |
| 3,835,372 | 9/1974 | Adair | 340/203 |
| 3,852,726 | 12/1974 | Romanelli | 340/188 R |
| 3,962,691 | 6/1976 | Langenfeld | 340/188 R |
| 3,992,705 | 11/1976 | Langenfeld | 340/203 |
| 4,004,097 | 1/1977 | Spaulding | 340/188 R |
| 4,132,981 | 1/1979 | White | 340/203 |

Primary Examiner—James J. Groody
Attorney, Agent, or Firm—Edward F. Levy

[57] ABSTRACT

A meter reader assembly is adapted for mounting on a standard utility meter having a plurality of rotating dial elements for visually indicating total units of the utility consumed. The assembly includes a magnetic reed switch fixedly mounted adjacent the single meter dial element which indicates the lowest whole unit of utility volume consumed, and one or more permanent magnets mounted on this single dial element in a position to traverse the reed switch each time the single dial element rotates through a distance to indicate the consumption of a single whole unit of utility. The reed switch opens and closes each time it is traversed by a magnet to produce an electrical pulse in a logic circuit which also contains a summing circuit for totalling the pulses, and a shift register memory. The logic circuit is electrically connected to interrogator means which interrogates the shift register memory and transmits the stored information received therefrom, as to total units measured by the meter, to a remote display or printout.

9 Claims, 6 Drawing Figures

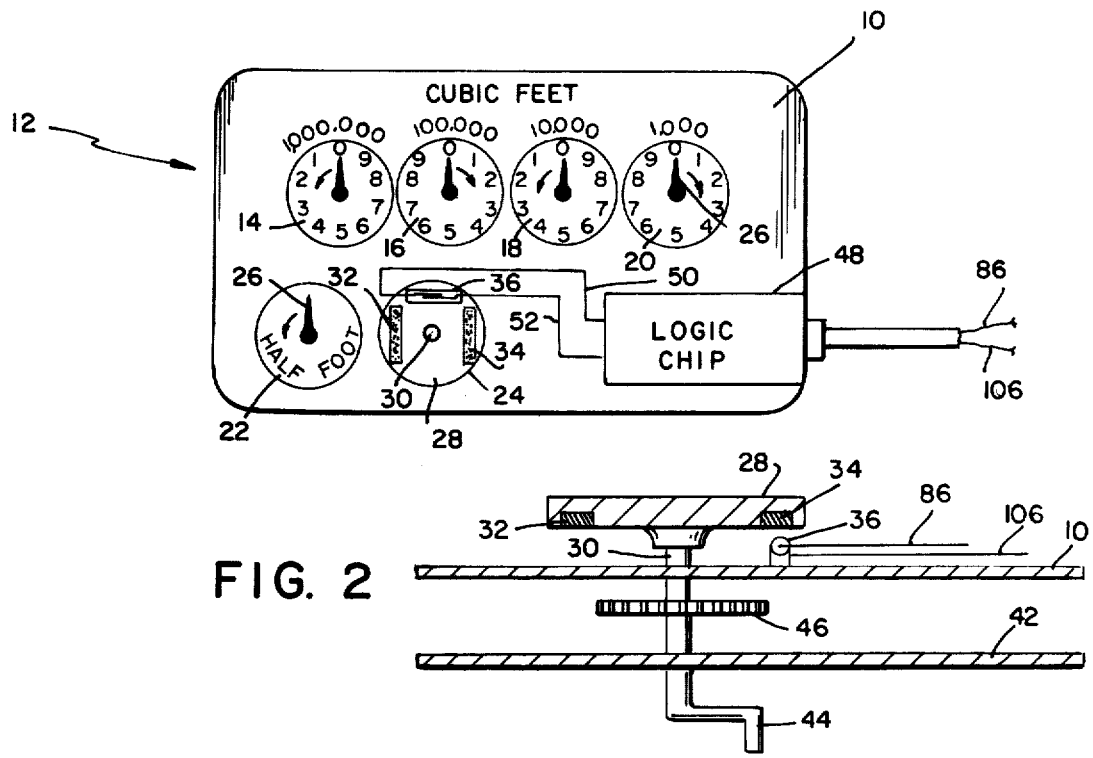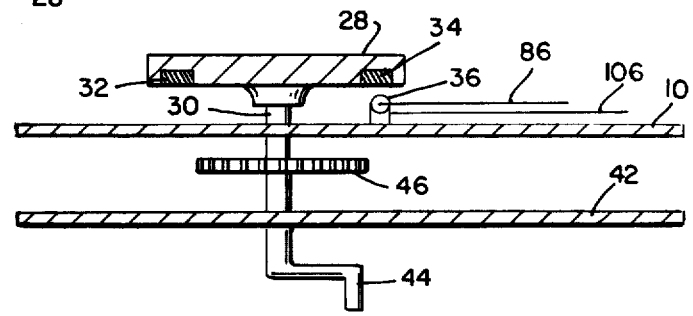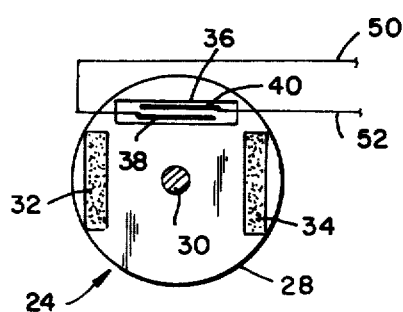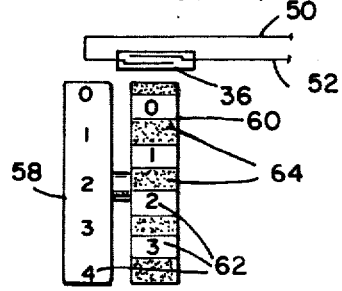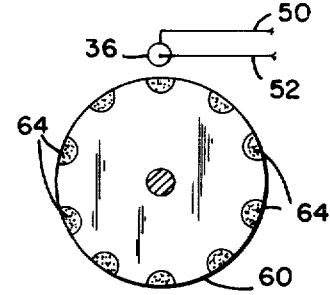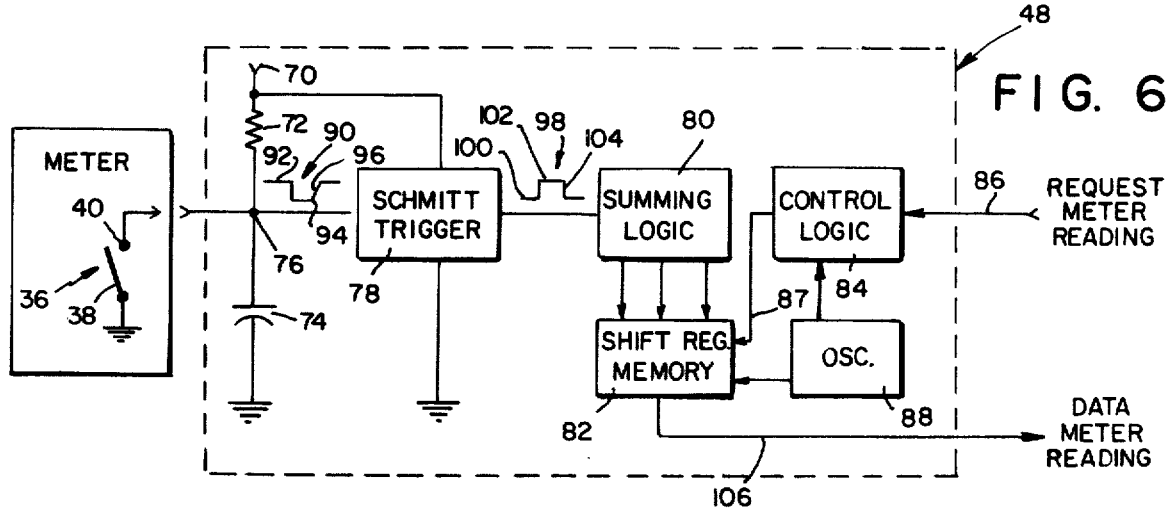

ELECTRONIC REMOTE METER READING APPARATUS

The present invention relates to meter reading apparatus and in particular to a novel and improved electronic apparatus for obtaining usage information from a meter, converting such information to electrical signals for transmission to another location, and thereafter converting the signals to observable information indicative of such meter information or storing said signals for future retrieval.

In U.S. Pat. No. 3,852,726 entitled "Remote Meter Monitor" there is shown and described apparatus for remotely monitoring meter information wherein a clock-type utility meter within a house is monitored and the meter reading is converted to a digital readout at a remote location outside of the house. This meter monitoring apparatus essentially comprises a circular array of magnetic reed switches mounted upon each dial of the meter, with a reed switch located in registry with each numeral on each dial. Each dial also has a pointer having a magnetic free end which actuates the reed switches on the respective dial successively as the pointer traverses the dial face, thereby producing digital signals representing an analog-type meter reading. The digital signals are transmitted by cable to a remote location outside of the house to provide a numerical digital readout by means of a decade array of light emitting diodes which are electrically in circuit with the respective reed switches.

The aforementioned meter monitor apparatus shown in U.S. Pat. No. 3,852,726 is effective in enabling a utility company meter reader to obtain information as to meter usage from outside the house in which the meter is located, without having to gain access to the interior of the house. However, each of the dials of the meter requires the installation of ten magnetic reed switches thereon, so that in the usual clock-type utility meter having at least four dials, at least forty magnetic reed switches are required, so that the apparatus is expensive to manufacture and install. In addition, the apparatus is adaptable for installation only on clock-type meters and cannot be used on other types of meters such as odometer-type meters.

It is an object of the present invention to provide meter reading and monitoring apparatus of a simplified construction which is more economical in manufacture and installation and in which only a single hermetically sealed magnetic reed switch is employed in the meter. The single reed switch is preferably positioned in association with the meter dial which indicates the lowest unit of utility usage and is connected within a logic circuit which adds up the usage units and transmits the sum, when desired, to a remote location where a readout is provided.

Another object of the invention is to provide meter reading apparatus of the character described which is capable of gathering meter information and storing the same over extended periods of time, and for immediate retrieval when desired.

Another object of the invention is the provision of meter reading apparatus of the character described which utilizes a single magnetic reed switch associated with proximate magnetic means carried by a functional rotatable disc motivated by the flow through the meter of a particular utility such as water, gas, electricity or the like, which apparatus can be easily incorporated into existing meters without any major modification.

Still another object of the invention is the provision of a meter reading apparatus of the character described which is capable of providing meter information which can be coded, stored and later retrieved by the utility company from time to time for readout or printout either at the user's premises or at a remote location by telephone or radio triggering devices.

A further object of the invention is the provision of a meter reading apparatus of the character described which is adaptable for use in hazardous environments since the reed switch is hermetically sealed and of microampere output and the reed contacts cannot be exposed to volatile gases or the like.

In accordance with the invention there is provided meter reading apparatus for use with a meter having at least one rotatably driven dial element indicating units of utility measured by the meter. The meter reading apparatus comprises magnetic means mounted on the dial element of the meter for rotation therewith, and a single magnetic field sensitive element fixedly mounted on the meter and positioned to register intermittently with the magnetic means as the dial element is rotated to produce an electrical signal in response to each field interception during rotation of the dial element. The meter reading apparatus also includes signal processing means for receiving the electrical signals to produce a unit pulse indicative of each field interception of said sensitive element by said magnetic means, counting means for receiving and summing said pulses to indicate the total units of utility measured by said meter, storage means for receiving said total units of information of utility measured and storing the same for future information, and interrogator means for selectively interrogating the storage means for receiving and transmitting information as to the total units measured over a selected time period.

In one preferred embodiment of the invention, the meter is a clock-type meter having a plurality of dials associated with rotatable pointers, and the rotatably driven dial element is a disc mounted on the pointer drive shaft of one of said dials. The magnetic field sensitive element is a magnetic reed switch mounted proximate to said disc, and at least one magnet is mounted on the disc in a position to register with the magnetic reed switch and actuate the same to close and reopen as the magnet traverses the switch. This closing and reopening of the reed switch produces the electrical signal which is indicative of a selected unit of utility consumption measured by the meter and which is converted to said unit pulse by the signal processing means.

In another embodiment of the invention, the meter is of the odometer type with a series of discs arranged parallel to each other in a row, and numerals from zero to nine equally spaced about the circumference of each disc. A permanent magnet is mounted between each adjacent pair of numerals on the disc which indicates the lowest units of utility consumption measured by the meter, and the magnetic reed switch is so located that it is traversed by the magnets successively as the disc rotates.

Additional objects and advantages of the invention will become apparent during the course of the following specification when taken in connection with the accompanying drawings, in which:

FIG. 1 is a plan view of the index face of a typical clock-type gas meter having dial faces calibrated in multiple units of cubic feet, and showing magnets and a magnetic reed switch, constituting a portion of the meter reading apparatus of the present invention, associated with the two foot dial of the meter;

FIG. 2 is a side elevational view of the two foot dial of the meter of FIG. 1, showing the positioning of the magnet and magnetic reed switch associated therewith;

FIG. 3 is an enlarged plan view of the two foot dial and associated meter reading structure shown in FIG. 1;

FIG. 4 is a side elevational view of two of the dials of an odometer-type meter, showing the manner in which magnets and a magnetic reed switch are associated therewith in accordance with the present invention;

FIG. 5 is a side view of the odometer dial shown in FIG. 4 showing the magnets and magnetic reed switch associated therewith; and FIG. 6 is a schematic and function block diagram showing the switch and electronic portions of the meter reading apparatus.

Referring in detail to the drawings, there is shown in FIG. 1 a preferred embodiment of meter reading apparatus made in accordance with the present invention, and applied to the dial plate 10 of a meter 12, which for purposes of illustration is shown as a gas meter. The dial plate 10 is formed with dials 14, 16, 18 and 20 which respectively represent volume of gas usage in decade stages of millions, hundred thousands, ten thousands, and thousands of cubic feet. Two additional dials 22 and 24 represent volume of gas usage in increments of one-half cubic foot and two cubic feet respectively.

Each of the dials 14, 16, 18 20 and 22 is associated with the usual pointer 26, but, for purposes of the invention herein, the dial face 24 underlies a circular disc 28 which is affixed to the pointer shaft 30 of the dial 24.

Mounted on the under surface of the disc 28 are a pair of permanent magnets 32 and 34 which are equally spaced radially from the pointer shaft 30 and are diametrically opposed from each other. Mounted on the dial plate 10 beneath the disc 28 is a hermetically-sealed magnetic reed switch 36 which is positioned to register with the respective magnets 32 and 34 as the disc 28 is rotated. The reed switch 36 has the usual contacts 38 and 40, which, in FIGS. 1 and 3 are shown in open position. When either of the magnets 32 or 34 move into registry with the reed switch 36, the contacts 38 and 40 are closed in response to the magnetic field created by said magnet.

In FIG. 2 there is shown a side view of the disc 28 and its underlying dial plate 10. In this view it will be seen that the pointer shaft 30 mounting the disc 28 extends through the dial plate 10 and also through an underlying plate 42, terminating in a crank arm 44, which is of a well-known construction and which is turned by the conventional bellows assembly (not shown) of the gas meter. The shaft 30 also carries a toothed gear 46 which meshes with conventional gearing (not shown) of the gas meter to drive the pointers 26 of the other dials 14, 16, 18, 20 and 22 in their proper ratios.

Since the dial 24 is calibrated to indicate the flow of two cubic feet of gas, the disc 28 turns through one complete revolution with each passage of two cubic feet of gas. In one complete revolution of the disc 28 each of the two magnets 32 and 34 will come into registry with the underlying reed switch 36, so that the contacts 38 and 40 of the reed switch are closed twice for each revolution of disc 28, i.e., the reed switch 36, which is normally open, is closed once in response to passage of one cubic foot of gas. It will be understood that the meter reading apparatus of the present invention may be installed in gas meters of other constructions or in meters of different types, such as water meters, electric meters, etc. In meters in which the lowest unit dial is constructed to provide one revolution for the passage of one cubic foot of gas, only one magnet will be mounted on the disc 28, and the reed switch 36 will be closed once for each revolution of the disc 28, representing the passage of one cubic foot of gas.

The contacts 38, 40 of the reed switch 36 are electrically connected to an external receiving device such as a logic chip 48, by leads 50 and 52. As shown in FIG. 1, the logic chip 48 may be mounted on the dial plate 10.

As the disc 28 rotates, each magnet 32 and 34 will successively move into registry with the magnetic reed switch 36, and when the magnet is directly over the reed switch and at maximum flux density, the switch contacts 38 and 40 will close to make contact. As the magnet moves away from reed switch 36, the magnetic field is weakened and the switch contacts 38 and 40 open. The reed switch 36 thus produces a pulse, indicating the passage of one cubic foot of gas, and each such pulse is fed to the logic chip 48, energizing circuitry therein, as will be presently explained.

FIGS. 4 and 5 illustrate another embodiment of meter to which the magnet and reed switch of the invention are applied, the meter in this instance being of the odometer type. An odometer-type meter includes a plurality of closely spaced parallel discs in which calibration numerals are printed on the disc peripheries, and each disc depicts ten units numbered from zero to nine. In this type of meter, the disc on the right-hand end indicates units from zero to nine, the next disc represents units from ten to ninety, the next disc hundreds, etc. Each complete revolution of one disc indexes or causes the next adjacent disc in the sequence to turn through the increment of one unit, etc.

FIG. 4 shows two of the discs 58 and 60 of an odometer-type meter, each having a circumferential row of equally-spaced numerals 62 numbered from zero to nine. The disc 60 represents single units of passage of cubic feet of gas, while the disc 58 represents units of tens, and additional discs (not shown) will represent units of hundreds, thousands, ten-thousands, etc. as required.

In accordance with the invention herein, a permanent magnet 64 is mounted between each of the numerals 62 on the disc 60, and a magnetic reed switch 36, identical to that shown in FIGS. 1 and 3, is mounted adjacent the disc 60 in such a position that the magnets 64 move into successive registry with the reed switch 36 to close the latter once for each succeeding passage of one cubic foot of gas. With each closing and opening of the reed switch 36, an electrical signal or pulse is generated through leads 50 and 52 to the logic chip 48, where the pulses are selectively processed to provide subsequent digital information relative to the amount of utility used or consumed by the customer, as will now be described.

FIG. 6 is a schematic block diagram illustrating the circuit components of the logic chip 48 of FIG. 1, and showing the manner in which the pulses produced by the reed switch 36 are converted to information indicative of the parameters used to measure the item under observation. The logic chip includes an RC input network in which a DC power source 70 is connected through a resistor 72, and capacitor 74, to ground. The reed switch 36 has one end connected to ground and the other end adapted for connection to terminal 76 connected to the junction of resistor 72 and capacitor 74.

Logic chip 48 further includes a Schmitt trigger circuit 78 having its input connected to junction terminal 76 and its output connected to summing logic circuit 80 whose output is connected to the input of shift register memory 82.

In order to provide for interrogation of memory 82, logic chip 48 includes a control logic circuit 84 and an oscillator circuit 88. The control logic circuit 84 has an input lead 86 and an output lead 87 connected to memory 82. The output oscillator circuit 88 is respectively connected to memory 82 and control logic circuit 84.

In operation, when a magnet is in close proximity to reed switch 36, the magnetic field produced by the magnet causes reed switch contact 38 to close. Contact 38 will thus remain closed until a reduction in the magnetic field intensity caused by the departure of the magnet releases contact 38, allowing it to open. The closing and opening of reed switch 36, in response to the passage of the magnet into and out of proximity therewith, causes the RC network to produce a pulse waveform 90 at junction 76 in the following manner:

While reed contact 38 is open, capacitor 74 will be charged up to a voltage approaching the voltage of DC power source 70, this voltage level indicated by line 92 in waveform 90.

Closure of reed contact 38 under the influence of the magnetic field produced by a magnet causes reed switch 36 to short circuit capacitor 74 to ground, thereby causing the voltage level at junction 76 to drop sharply to ground level as indicated by line 94 in waveform 90. The departure of the magnet and the removal of its magnetic field from reed switch 36 allows reed switch 36 to open thus allowing capacitor 74 to gradually charge up through resistor 72 and DC power supply 70 toward the voltage of the latter, at a rate determined by the values of resistor 72 and capacitor 74. The rising voltage at junction 76 due to this charging action is indicated by line 96 in waveform 90.

Schmitt trigger circuit 78 is operative to produce a sharply stepped (i.e. square wave) output for input waveforms of varying and irregular slope. Thus, Schmitt trigger circuit 78 will "fire" when the voltage input thereto exceeds a predetermined voltage level to produce the square waveform 98.

In operation, when the voltage input to Schmitt trigger circuit 78 drops from level 92 to level 94, the voltage output thereof indicated by waveform 98 will sharply rise from voltage level 100 to level 102. As the input voltage rises, Schmitt trigger 78 will not "fire" until the input voltage indicated by line 96 reaches a predetermined level and when it does so the output voltage will sharply drop as indicated by line 104 in waveform 98, thus producing a sharp square wave output pulse for each input pulse produced at junction 76.

Because Schmitt trigger circuit 78 will fire only when the input voltage thereto exceeds a predetermined value, ripples in the voltage at junction 76 caused by bouncing of reed contact 38 or other sources of electrical noise will be of insufficient magnitude to cause Schmitt trigger circuit 78 to "fire". Accordingly, Schmitt trigger circuit 78 prevents the production of erroneous noise pulses and provides a "clean" square waveform for each opening and closure of reed switch 36.

Output pulses 98 are fed to summing logic circuit 80 which counts the same and feeds this pulse count information to shift register memory 82 which receives and stores this pulse count information and makes such information subject to retrieval upon demand.

When it is desired to "read" the pulse count information in memory 82, an interrogating signal is applied via lead 86 to control logic circuit 84 which causes memory 82 to feed the pulse count information through its output 106 to a data meter reading display (not shown).

The input and output leads 86, and 106 may be connected to a socket member located at the exterior of the building in which the meter is located, the manner described in U.S. Pat. No. 3,852,726. In this instance, a meter reader employed by the utility company may plug in a portable monitor unit which will display a reading representing the total units of utility measured by the meter. Preferably, however, the leads 86 and 106 are employed to tie in the logic chip 48 to a telephone circuit for remote readout or printout by the utility company. The interrogation signal may be transmitted through input lead 86 via the telephone line when desired by the utility company, or the meter information may be retrieved at regular pre-arranged intervals by means of a computor system. This may be accomplished by means of tape on which the telephone numbers of individual customers are recorded, so as to call automatically at programmed times and at off hours, without ringing the telephone bell of the customer. The information withdrawn from the IC chip memory is recorded on tape for transfer to a readout or printout device. The same system can be applied to remote gas or oil well meters for which helicopters or boats are normally used to obtain readings. Readings from these industrial meters can be obtained via radio, upon signal from a central station, to be recorded or displayed. The apparatus of the present invention is thus adaptable for use in any type of meter or device where a continual reading of gas or fluid is required. The system is foolproof since the original mechanical readout of the meter is always available for checking by a direct reading without the loss of vital information.

The extremely low drag of the magnet and reed switch combination makes the meter reading assembly highly suitable for use with electrical meters. The memory employed is preferably of the type which stores information magnetically, so that it is capable of retaining the stored data, in the event that the main system power is shut down or interrupted, for as long as a period of 300 hours. A Ni-cad battery can also be incorporated in association with the power supply so as to extend the period of memory storage time, where necessary.

While preferred embodiments of the invention have been shown and described herein, it is obvious that numerous omissions, changes and additions may be made in such embodiments without departing from the spirit and scope of the invention.

What is claimed is:

1. Apparatus for converting a standard meter, having a plurality of rotatably driven dial elements indicating total units of a utility measured by said meter, into a meter capable of being read from a remote location, said apparatus comprising magnetic means mounted on the single dial element of said meter which indicates the lowest whole unit of utility consumption measured, said magnetic means being mounted for rotation with said single dial element, a single magnetic field sensitive element fixedly mounted on said meter in proximity to said single dial element and positioned to register intermittently with said magnetic means as said single dial element is rotated to produce an electrical signal in response to each field interception during rotation of said single dial element, said magnetic means comprising at least one permanent magnet secured to said single dial element and positioned to produce one said electrical signal in response to the consumption of a single whole unit of utility consumed and indicated by said single dial element, signal processing means for receiving said electrical signals to produce a unit pulse indicative of each field interception of said sensitive element by said magnetic means, counting means for receiving and summing said pulses to indicate the total units of utility measured by said meter, storage means for receiving said total units of information of utility measured and storing the same in a memory bank for future information, and interrogator means for selectively interrogating said storage means for receiving and transmitting information as to the total units measured over a selected time period.

2. Meter reading apparatus according to claim 1 in which said magnetic field sensitive element comprises a magnetic reed switch.

3. Meter reading apparatus according to claim 1 in which said meter is a clock-type meter, and in which a disc is mounted on said single dial element for rotation therewith, said permanent magnet being mounted on said disc.

4. Meter reading apparatus according to claim 3 in which said magnetic field sensitive element comprises a magnetic reed switch mounted on said meter in a position to register with said magnetic means.

5. Meter reading apparatus according to claim 1 in which said meter is of the odometer type and in which said single dial element is a disc having on its circumference a decade array of numerals spaced equally about the circumference thereof with each numeral representing a successive single unit of volume of the utility measured by said meter, said magnetic means comprising a plurality of permanent magnets mounted on said disc and respectively associated with each of said numerals.

6. Meter reading apparatus according to claim 5 in which said meter includes a plurality of dial discs, with each disc having a decade array of numerals spaced about its circumference, and with said permanent magnets mounted between the numerals of the disc which indicates the lowest units of utility measured.

7. Meter reading apparatus according to claim 1 in which said signal processing means comprises trigger means operative to produce a square wave output pulse when the input thereto, produced by each said electrical signal, reaches a predetermined level.

8. Meter reading apparatus according to claim 7 in which said trigger means comprises a Schmitt trigger circuit.

9. Meter reading apparatus according to claim 1 in which said storage means comprises additive and shift register logic means for totalling up and storing unit pulses over extended time periods for future recall and retrieval by said interrogator means.

* * * * *